(12) United States Patent
Bueti et al.

(10) Patent No.: US 7,308,668 B2
(45) Date of Patent: Dec. 11, 2007

(54) APPARATUS AND METHOD FOR IMPLEMENTING AN INTEGRATED CIRCUIT IP CORE LIBRARY ARCHITECTURE

(75) Inventors: Serafino Bueti, Waterbury, VT (US); Adam J. Courchesne, Belchertown, MA (US); Kenneth J. Goodnow, Essex, VT (US); Gregory J. Mann, Winfield, IL (US); Stanley B. Stanski, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 141 days.

(21) Appl. No.: 11/160,609

(22) Filed: Jun. 30, 2005

(65) Prior Publication Data

US 2007/0006108 A1  Jan. 4, 2007

(51) Int. Cl.
*G06F 17/50* (2006.01)
*G06F 9/45* (2006.01)

(52) U.S. Cl. .................... 716/8; 716/1; 716/17; 716/18

(58) Field of Classification Search ................ 716/1–3, 716/16–18, 8; 703/1; 709/252; 370/407; 398/61–64
See application file for complete search history.

(56) References Cited

U.S. PATENT DOCUMENTS

| | | | |
|---|---|---|---|
| 5,610,832 A | 3/1997 | Wikle et al. | 364/491 |
| 5,850,537 A * | 12/1998 | Selvidge et al. | 716/12 |
| 6,154,051 A * | 11/2000 | Nguyen et al. | 326/41 |
| 6,181,163 B1 * | 1/2001 | Agrawal et al. | 326/41 |
| 6,550,042 B1 | 4/2003 | Dave | 716/5 |
| 6,557,145 B2 | 4/2003 | Boyle et al. | 716/2 |
| 6,601,126 B1 | 7/2003 | Zaidi et al. | 710/305 |
| 6,634,088 B1 * | 10/2003 | Morrone | 29/607 |
| 6,693,452 B1 * | 2/2004 | Ansari et al. | 326/38 |
| 6,754,763 B2 | 6/2004 | Lin | 710/317 |
| 6,774,412 B2 | 8/2004 | Komaki | 257/207 |
| 6,785,876 B2 * | 8/2004 | Takemura | 716/7 |
| 7,080,300 B1 * | 7/2006 | Herron et al. | 714/726 |
| 7,124,376 B2 * | 10/2006 | Zaidi et al. | 716/1 |
| 7,165,229 B1 * | 1/2007 | Gathoo et al. | 716/1 |
| 2002/0140001 A1 | 10/2002 | Komaki | 257/207 |
| 2003/0163798 A1 | 8/2003 | Hwang et al. | 716/16 |
| 2003/0229482 A1 | 12/2003 | Cook et al. | 703/14 |
| 2004/0022107 A1 | 2/2004 | Zaidi et al. | 365/202 |
| 2004/0107214 A1 | 6/2004 | Hung et al. | 707/104.1 |
| 2004/0255152 A1 * | 12/2004 | Kanamori et al. | 713/201 |
| 2005/0040851 A1 | 2/2005 | New | 326/41 |

FOREIGN PATENT DOCUMENTS

WO  WO 03/091914 A1  6/2003
WO  WO 2004/068535 A1  12/2004

* cited by examiner

*Primary Examiner*—Thuan V. Do
*Assistant Examiner*—Nghia M. Doan
(74) *Attorney, Agent, or Firm*—Cantor Colburn LLP; Michael LeStrange (57) ABSTRACT

An integrated circuit (IC) architecture includes a library of intellectual property (IP) cores configured to provide a plurality of individual circuit functions. The IP cores arranged in a manner compatible with a customized, functional selection of individual ones of the IP cores, wherein individually selected cores are accessible through a communication structure included within the library.

15 Claims, 7 Drawing Sheets

APPARATUS AND METHOD FOR IMPLEMENTING AN INTEGRATED CIRCUIT IP CORE LIBRARY ARCHITECTURE

BACKGROUND

The present invention relates generally to integrated circuit devices and, more particularly, to an apparatus and method for implementing an integrated circuit intellectual property (IP) core library architecture.

As the mask costs for manufacturing ASICs (Application Specific Integrated Circuits) increase (e.g., a mask set for a chip is projected to be around 6 to 10 million dollars within the next 10 years), the need to reuse both masks and SOC (System On Chip) designs for multiple customers becomes more and more important. One particular problem associated with the fabrication of an SOC is determining which particular IP core(s) to use in the SOC. By using different IP cores on different customers' chips, the masks used in the formation thereof are, as a result, unique for each customer. Accordingly, a single IP core must therefore be reproduced on a separate mask for each customer.

One existing solution to this problem is to simply populate a chip with some of the basic IP cores required for the SOC and then populate the rest of the chip with FPGA (Field Programmable Logic Array) structures. The remaining IP core functions would then be downloaded into the FPGA to configure the SOC for that particular customer. However, one drawback with respect to this approach is the inefficiency of the FPGA structure in relation to a gate level version of the same IP, as well as the insecurity of the IP cores.

Another possible solution to this problem would be to provide predetermined sets of IP cores that would be treated as a library from a functional point of view, but would be treated as a single block of layout information. However, one problem with this approach lies in the challenge of creating an efficient architecture for the library of IP cores that can handle the requirements of I/O connections, processor bus connections, and irregular shapes of the different kinds of IP cores.

Accordingly, it would be desirable to be able to implement an IP core library architecture in a manner that allows for the unique functional requirements dictated by an customer's desired SOC, but that also reduces mask and verification costs while also providing a practical means of communication between the IP cores, the base or customer logic, and applicable I/O devices.

SUMMARY

The foregoing discussed drawbacks and deficiencies of the prior art are overcome or alleviated by an integrated circuit (IC) architecture including a library of intellectual property (IP) cores configured to provide a plurality of individual circuit functions. The IP cores arranged in a manner compatible with a customized, functional selection of individual ones of the IP cores, wherein individually selected cores are accessible through a communication structure included within the library.

In another embodiment, a system-on-chip (SOC) device includes a local microprocessor, a local memory device, a bus controller, and a library of intellectual property (IP) cores configured to provide a plurality of individual circuit functions. The IP cores are arranged in a manner compatible with a customized, functional selection of individual ones of said IP cores, wherein individually selected cores are accessible through a communication structure included within the library.

In still another embodiment, a method for implementing a customizable integrated circuit (IC) architecture includes configuring a library of intellectual property (IP) cores to provide a plurality of individual circuit functions, and arranging the IP cores in a manner compatible with a customized, functional selection of individual ones of the IP cores, wherein individually selected cores are accessible through a communication structure included within the library.

BRIEF DESCRIPTION OF THE DRAWINGS

Referring to the exemplary drawings wherein like elements are numbered alike in the several Figures.

DETAILED DESCRIPTION

Disclosed herein is a structural architecture that provides for a complete, dense library of IP cores on an integrated circuit. Such an architecture allows for a unique configuration of an SOC for a given customer, while at the same time reduces mask and verification costs. The library architecture is configured to include the numerous types of individual IP cores (and possibly duplicate copies thereof) used for a wide array of SOC and ASIC design. Examples of such IP cores may include, but are in no way limited to, bus interface cores, communications cores, digital signal processing cores, math cores, memory controller cores, processor cores, and peripheral cores, for example. The present library architecture further facilitates communication with the IP cores, along with access to external pins of the integrated circuit. The configuration of the selection of the IP may be programmable, either through a one time programming step, for example, or alternatively may be made more flexible through a volatile memory structure.

Briefly stated, the IP core library architecture implements, in one embodiment, the use of a star based communication structure. Such a communication structure utilizes a multi-bandwidth hierarchical structure, based on the physical location and requirements of the IP function. A method of connecting I/O to the different IP cores in a user selectable fashion is also disclosed herein. Thus configured, the disclosed architecture provides an advantageous solution to the problems of I/O connection, processor bus connection, and the irregular shapes of the different kinds of IP cores available.

Figure 1:
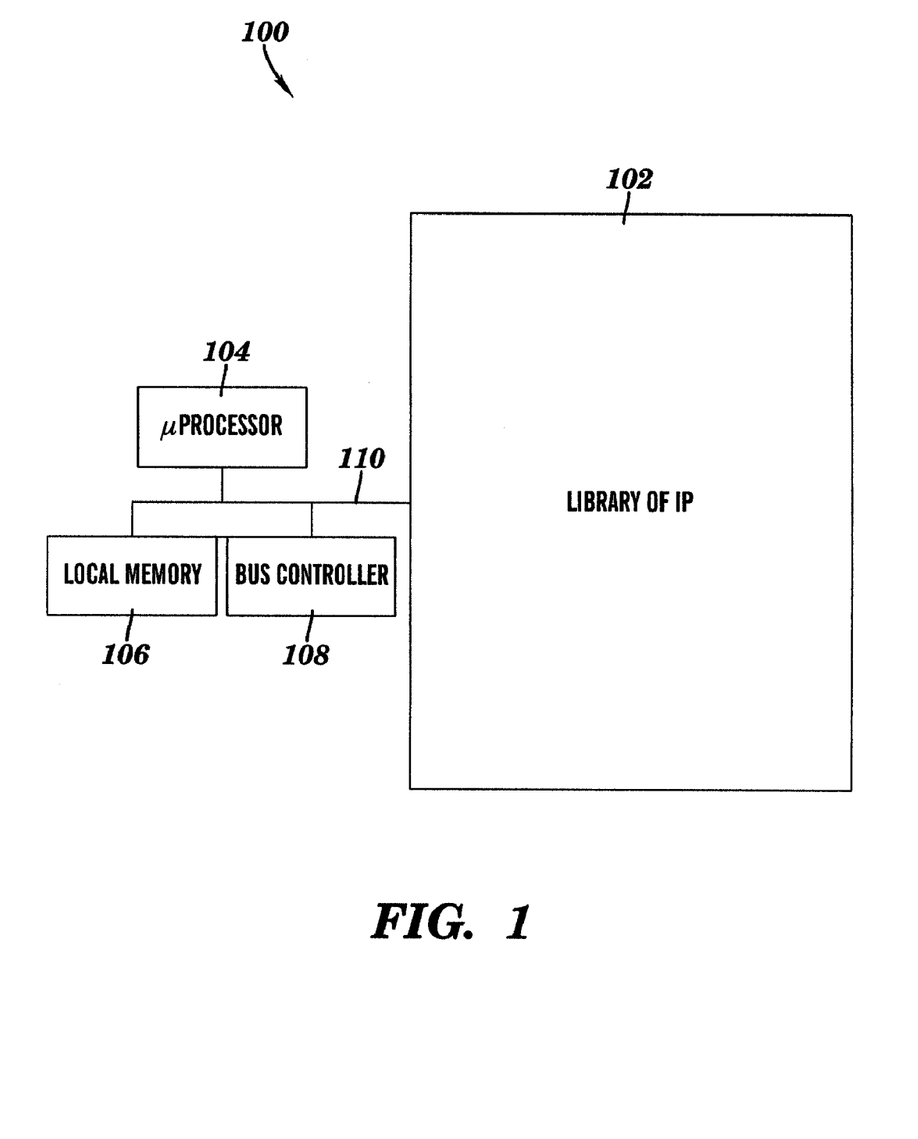
FIG. 1 is a block diagram illustrating a high level implementation of an exemplary SOC that may be configured to incorporate an IP core library, in accordance with an embodiment of the invention.

Referring initially to FIG. 1, there is shown a block diagram illustrating a high level implementation of an exemplary SOC 100 that may be configured to incorporate an IP core library 102 in accordance with an embodiment of the invention. In addition to a core library 102, the SOC 100 may include other basic IP cores such as, for example, a local microprocessor 104, a local memory 106, bus controller 108 (associated with communication bus 110 for communicating with the IP core library 102). Although not illustrated in FIG. 1, customer logic (such as embodied by an FPGA) could also be included within the exemplary SOC 100.

Figure 2:
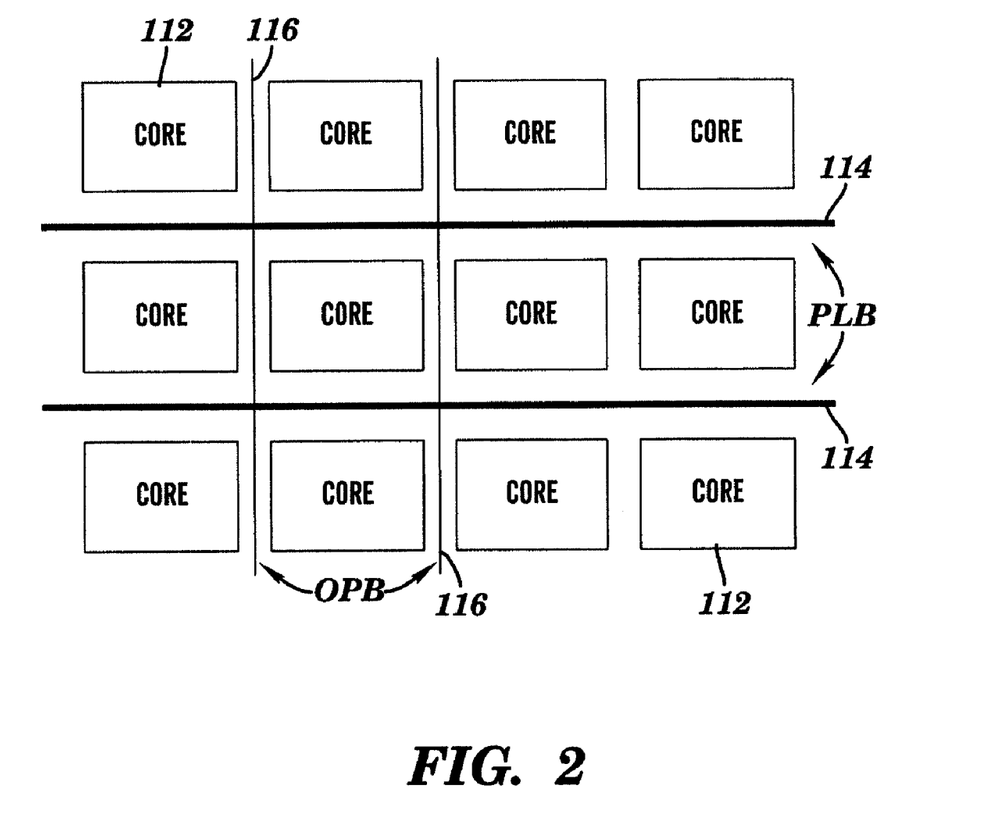
FIG. 2 illustrates a matrix structure of individual IP cores.

The IP core library 102 may be characterized by a matrix of individual IP cores having an intercommunication structure that allows each of the IP cores therein to communicate with the base IP cores (e.g., processor 104, memory 106, bus controller 108) and/or customer logic (not shown). One possible matrix structure of individual IP cores 112 is illustrated in FIG. 2. As is shown, a high-speed parallel bus (PLB) 114 and a slower speed parallel bus (OPB) 116 connects the IP cores 112 in a matrix-like fashion. This regularity of the matrix allows the cores 112 to be connected to the proper speed bus with a minimum of interconnection wiring.

With regard to communication of the cores 112 in the matrix with base IP cores (such as processor 104), certain considerations become an issue, such as physical connections, number of connections, timing, performance, power, and I/O connections, among others. More specifically, the problem of physical connection for example lies in the manner of how to efficiently lay out the IP cores, while at the same time maximizing connectivity and performance. The structure shown in FIG. 2 depicts an efficient packing mechanism given the validity of the following two assumptions: (1) that the core sizes are regular and uniform; and (2) that a given PLB or OPB bus can handle the bandwidth of communication for all the possible functional cores 112 connected to a given set of rows. However, as a practical matter, IP cores are not regularly and uniformly sized across a broad range of IP, unless the IP is substantially all the same. On the other hand, if all the IP cores are substantially the same, then the characteristics of a library of diverse functions (suitable for multiple SOC customers) is not met. Thus, the above architecture of FIG. 2 is too simplistic for implementation in a library type application.

Figure 3:
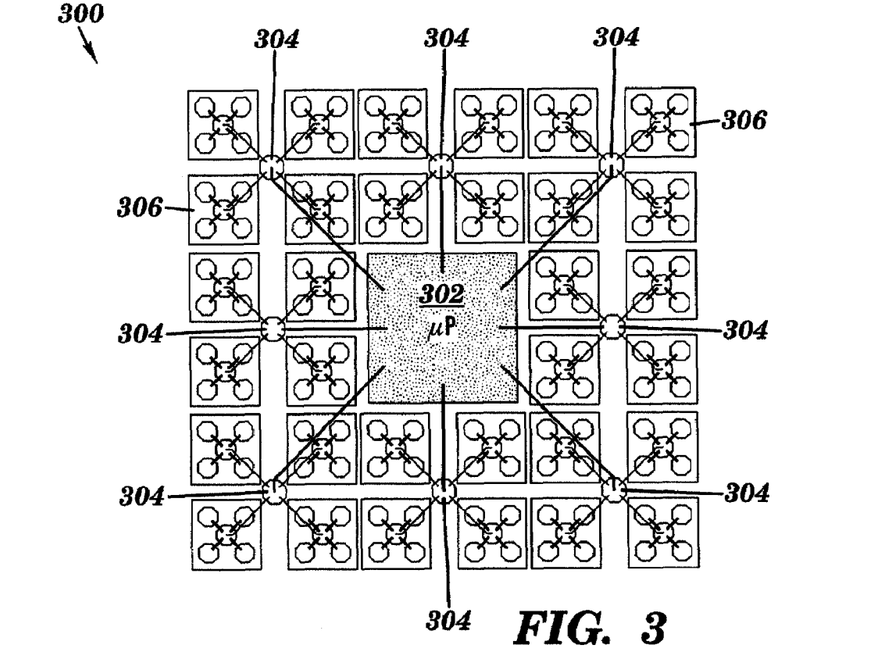
FIG. 3 is a schematic diagram of an exemplary IP core architecture for an SOC, in accordance with an embodiment of the invention.

Therefore, in accordance with an embodiment of the invention, an IP core library architecture is introduced that is flexible with regard to the size and requirements of different types of IP cores. As is illustrated herein, an exemplary embodiment of the present architecture incorporates different shapes and sizes of IP cores by utilizing a star-like structure having end nodes. Referring now to FIG. 3, an exemplary application of the present IP core architecture in an SOC 300 is shown, wherein a microprocessor 302 is a central focal point for a plurality of first level communication hubs 304. The first level communication hubs 304 are each connected to the central processor 302 by the highest speed/bandwidth bus available in the particular SOC 300 (e.g., PLB4, PLB5). For desired priority routing and spatial efficiency, the "corner" first level hub connections are routed with the use of diagonal wiring.

In addition, each of the first level hub connections 304 also serve as a focal point of a sub-cluster 306 of IP core elements. As is described later, the sub-clusters 306 individually address the problem of IP core size irregularity, different IP core bandwidth requirements, and I/O interconnections. Due to the local nature of the sub-cluster and the direct connection thereof to the associated first level hub connection 304, the timing problems of wiring different IP cores is minimized.

Figure 4:
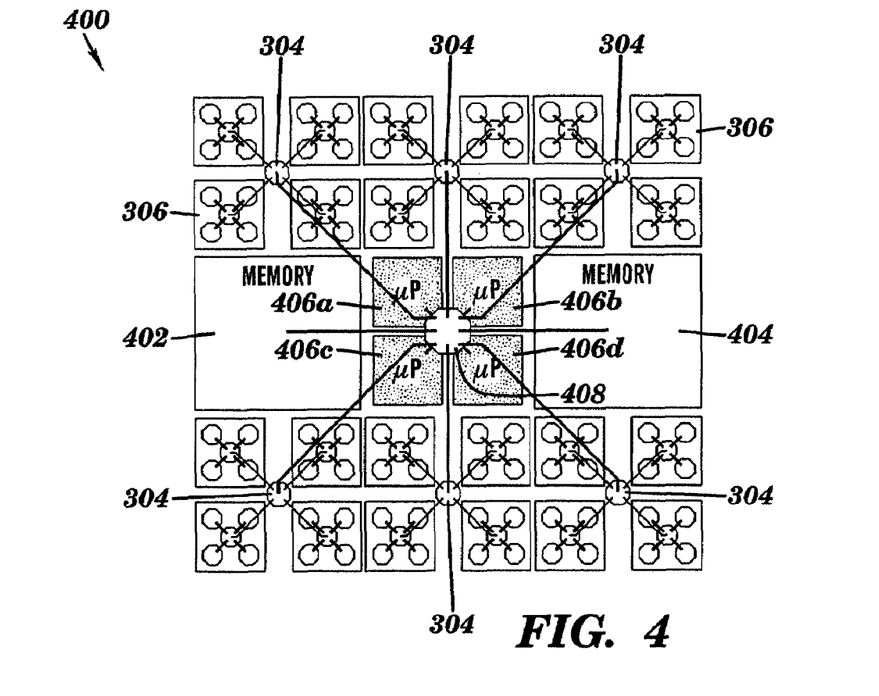
FIG. 4 illustrates an alternative embodiment of the SOC and IP core architecture of FIG. 3.

FIG. 4 illustrates an alternative embodiment of an SOC 400, including a pair of local memory cores 402, 404. Further, the local processing function is shown divided among four individual sub-processors 406a-406d. As a result, each of the first level hub connections 304 and the local memory cores 402, 404 are connected to a processor hub 408, which in turn is connected to the sub-processors 406a-406d. It will be noted, however, that the layout and configuration of the sub-clusters 306 is similar to the SOC 300 embodiment depicted in FIG. 3.

Figure 5:
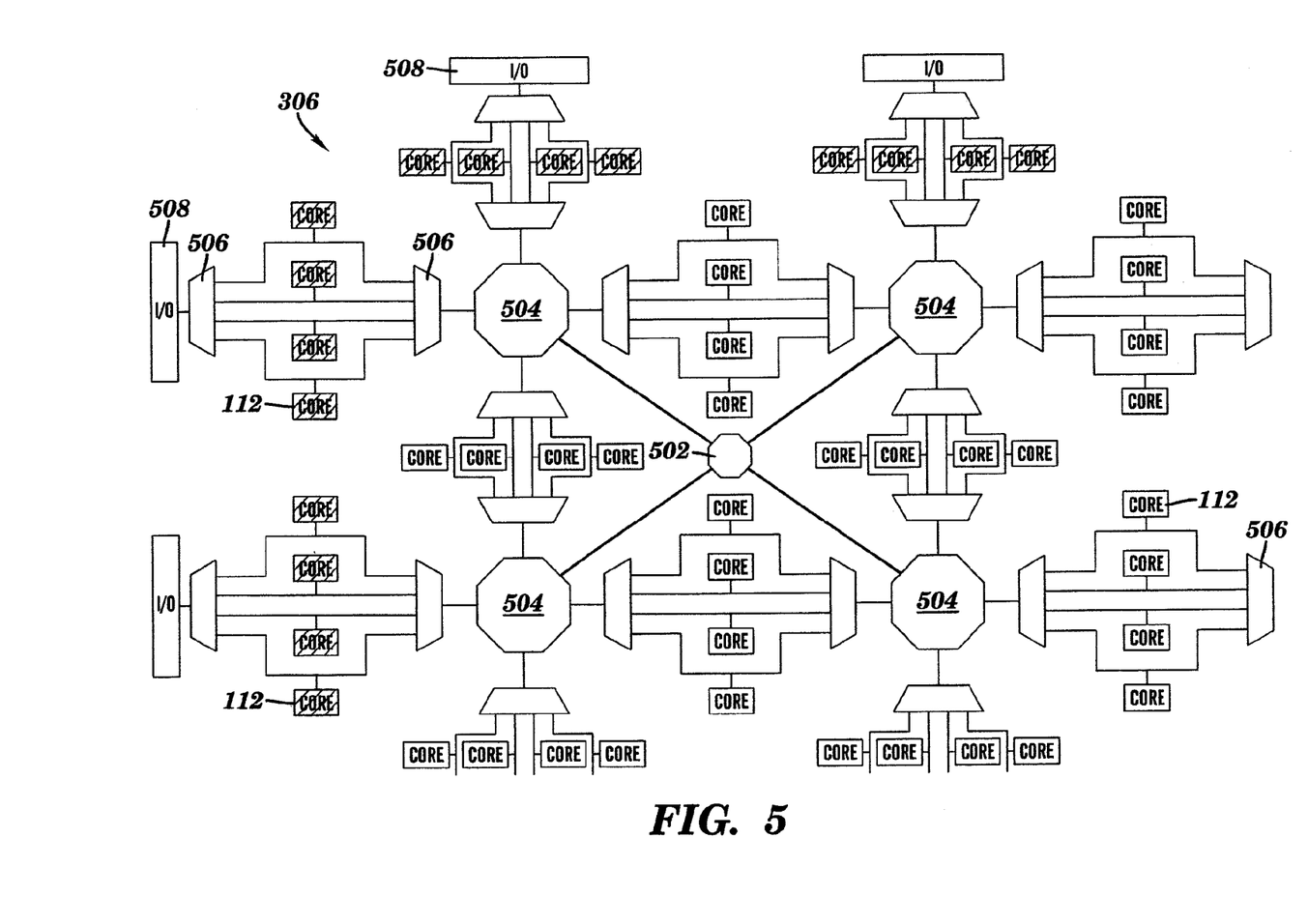
FIG. 5 is a schematic diagram of a detailed layout of an exemplary sub-cluster of the IP core architecture.

Referring now to FIG. 5, a more detailed layout of an exemplary sub-cluster 306 is illustrated. The sub-cluster 306 includes a plurality of IP cores 112, a second level hub connection 502 (coupled to a first level hub connection 304 such as shown in FIGS. 3 and 4), a plurality of third level hub connections 504 each coupled to the second level hub connection 502, a plurality of switching devices (e.g., multiplexers 506) and, in this embodiment, a plurality of I/O devices 508. More specifically, the IP cores 112 are laid out in a grid-like fashion with the third level hub connections 504 centrally located with respect to their respective sub-group of cores 112, and the second level hub connection 502 centrally located with respect to the third level hub connections 504.

As will be noted from the exemplary 4:1 multiplexing levels in the sub-cluster of FIG. 5, each core 112 is coupled to two individual multiplexers 506. The unshaded cores 112 represent those for which both multiplexers 506 are coupled to a third level hub connection 504, while the shaded cores 112 represent those for which one multiplexer 506 is coupled to a third level hub connection 504, and the other multiplexer 506 is coupled to an I/O device. It also will be noted that only one core 112 out of a set of four can communicate with a third level hub connection 504 or an I/O device 508. Furthermore, the unshaded cores 112 may communicate with one of two third level hub connections 504, but not both. Thus, out of the exemplary group of 48 IP cores 112, 16 may be active at one time.

Figure 6:
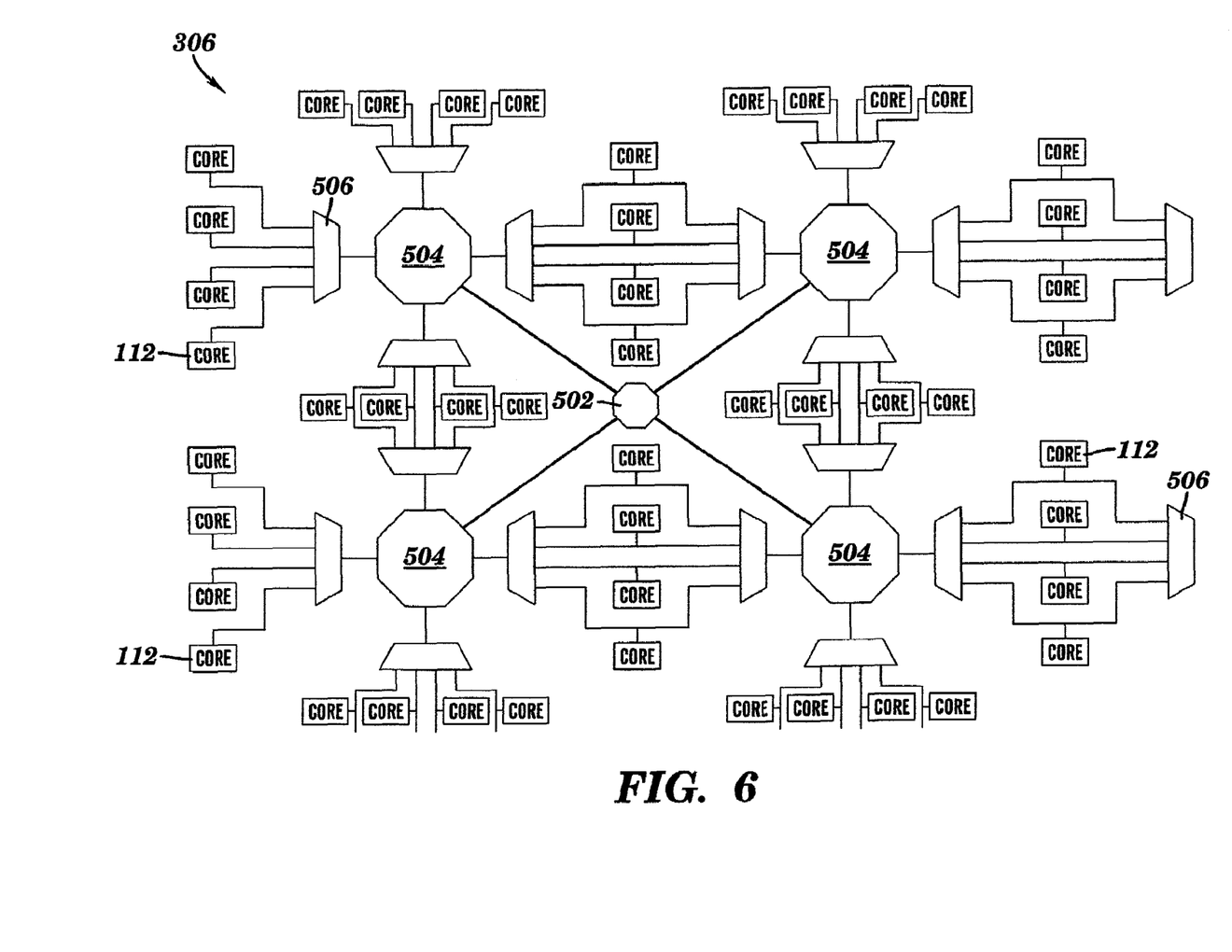
FIG. 6 is a schematic diagram of an alternative embodiment of the sub-cluster, shown without I/O devices.
Figure 7:
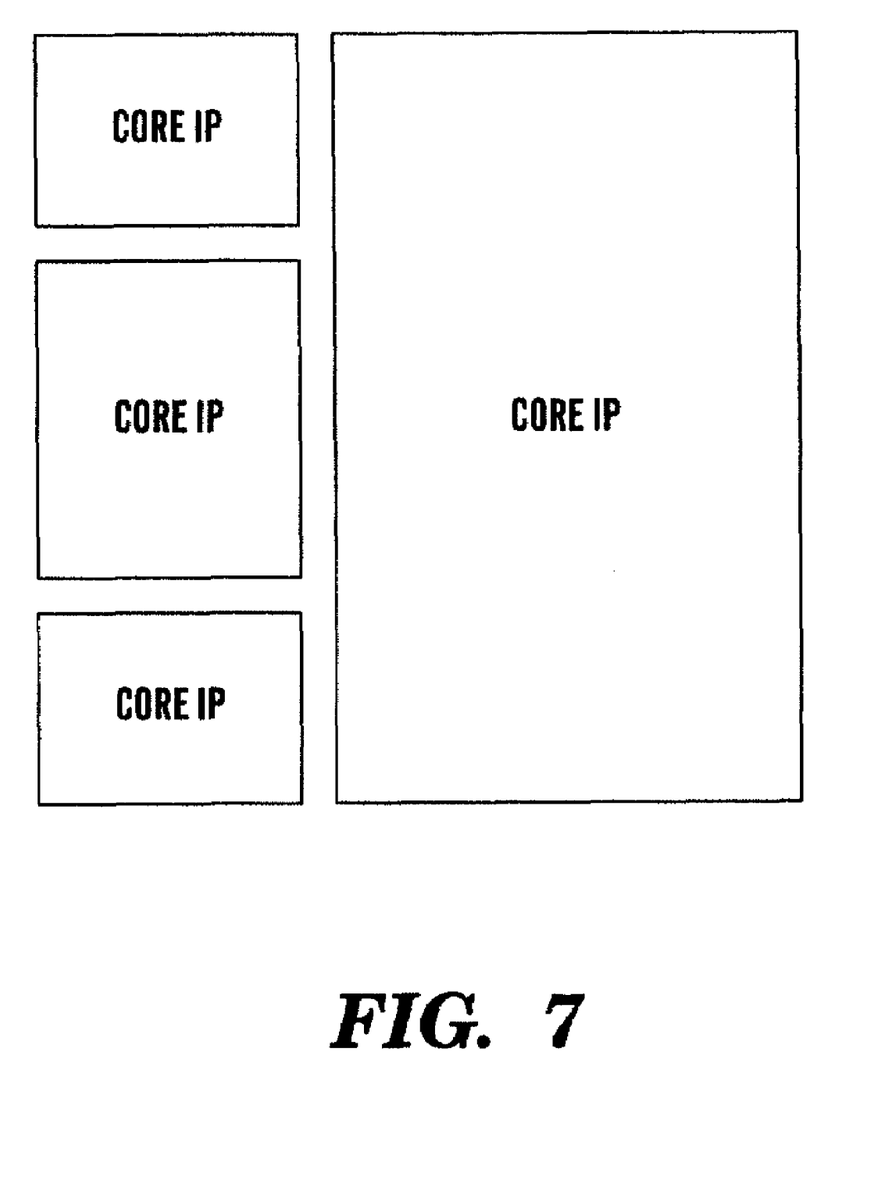
FIG. 7 depicts an example of individual IP cores that have various sizes with respect to one another.

FIG. 6 is an alternative embodiment of the sub-cluster 306 of FIG. 5, but without the I/O devices 508 of FIG. 5. In both instances, the sizes of the individual cores 112 are relatively uniform with respect to one another. However, an advantage of the present IP core architecture is that the size of the individual IP cores need not have to be uniform in order to make the bus connections work. For example, individual sub-clusters may be more heavily weighted toward one or more IP cores, in terms of the area occupied by the core(s). The block diagram of FIG. 7 depicts an example of individual cores 112 having different chip areas.

Figure 8:
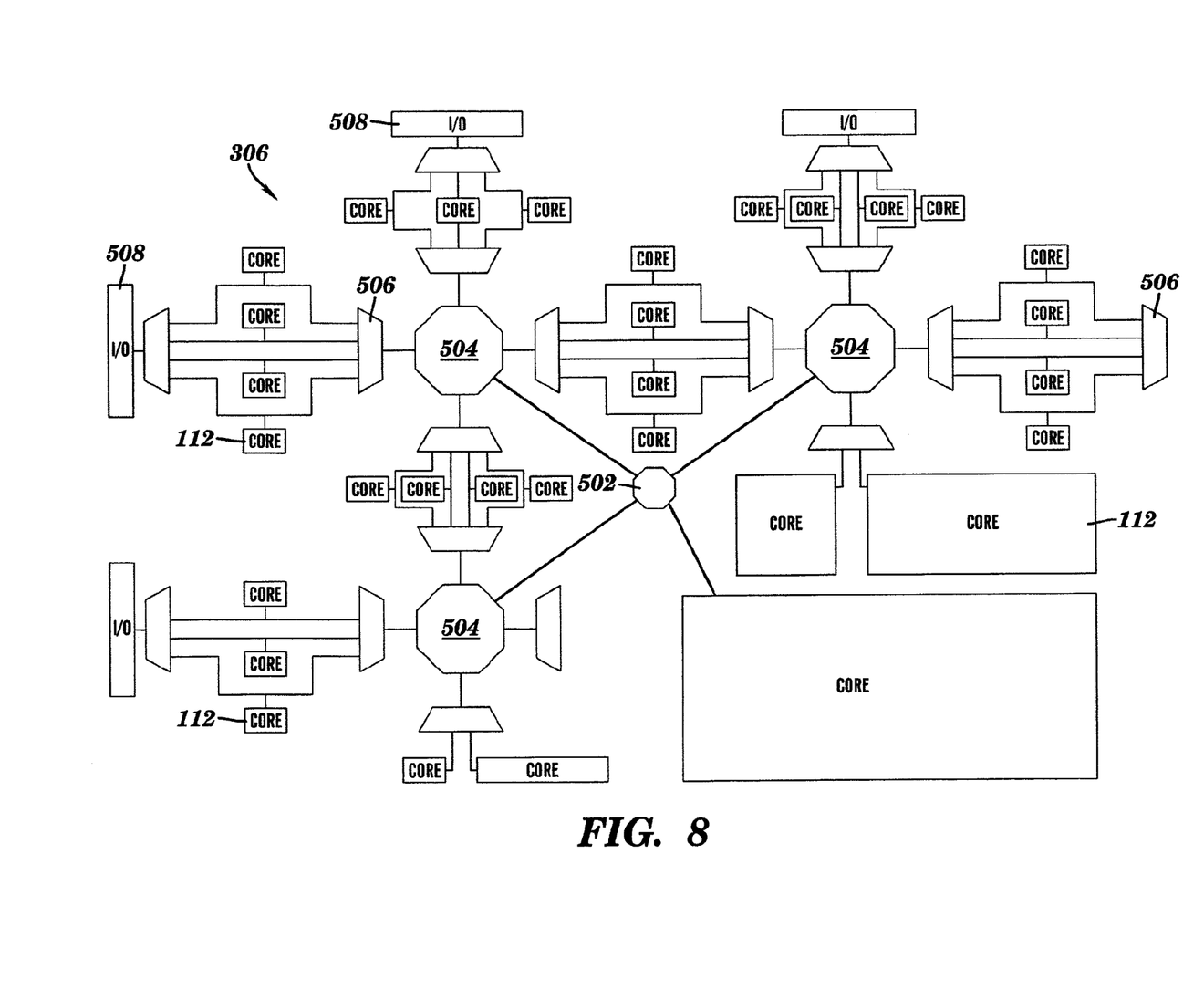
FIG. 8 is a schematic diagram of still an alternative embodiment of a sub-cluster that incorporates IP cores of different sizes.

Although individual IP cores 112 may have different chip areas, they may still be grouped in a manner that is still compatible with the cluster approach disclosed herein. As is illustrated in FIG. 8, the format entire sub-cluster design with different sized IP cores is maintained. In this example, the largest IP core is connected directly to the second level hub connection 502. Depending on the physical layout of a library, the timing of a given IP core with respect to a communication bus might otherwise be constrained. However, in the embodiments described above, since the core-to-bus distance to the bus is limited, the timing requirements are satisfied and the performance of the SOC in this regard is not constrained by the layout.

Another aspect of performance with respect to the SOC is the bandwidth of data movement required by an IP core connected to the bus during a functional mode. If a bus can handle, for example, 250 MHz worth of data movement and a given IP core uses 200 MHz of that bandwidth, then only 50 MHz of bandwidth is available for other IP cores on the same bus structure. Thus, an additional consideration is to laying out the IP cores in the clusters in a manner such that the bandwidth requirements of the IP cores that would routinely be connected to a bus do not exceed the bus bandwidth. Accordingly, it may be the case that certain high bandwidth cores would utilize a dedicated bus or, alternatively, are duplicated at more than one place in the cluster. Furthermore, the use of the above described cluster structure also provides the capability of connecting a core to two separate buses, which would in turn allow the bandwidth of a single core to be balance on two different buses.

Finally, in order to fully customize a SOC having the above described IP core library, a top level of "personalized" metal may be created. This top metal level may be created for each customer, ASSP or CSSP such that the final device functionally connects only those cores that are needed for the desired application. This metal layer would preferably be designed so as to allow multiple cores to be connected to an I/O, in addition to containing fat-wire crossbar type connections that would connect the core(s) to the power grid. However, where capacitance on the inter-core bus system becomes a concern, the top metal level could also be used to connect the core(s) to the bus. Accordingly, by connecting different resources to the core through a top level metal layer, the personalization and isolation of non-used cores is accomplished in a straight forward, cost effective manner.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An integrated circuit (IC) architecture, comprising:
   a library of intellectual property (IP) cores configured to provide a plurality of individual circuit functions;
   said IP cores arranged so as to enable a customized, functional selection of individual ones of said IP cores;
   wherein individually functional selected said IP cores are accessible through a star based communication structure included within said library, the star based communication structure further comprising:
      one or more first level communication hubs configured for communication with one or more external circuit devices with respect to said library;
      a plurality of sub-clusters in communication with each of said first level communication hubs, through second level communication hubs;
      said plurality of sub-clusters further comprising a plurality of third level communication hubs in communication with a corresponding one of said second level communication hubs; and
      subsets of said IP cores associated with a given sub-cluster are configured for selective coupling to one or more of said third level communication hubs.

2. The IC architecture of claim 1, further comprising:
   a given one of said third level communication hubs centrally located with respect to a subset of said IP cores associated therewith;
   a given one of said second level communication hubs of an associated sub-cluster centrally located with respect to said third level communication hubs in said associated sub-cluster; and
   a given one of said first level communication hubs centrally located with respect to a subset of sub-clusters associated therewith.

3. The IC architecture of claim 1, wherein connections between said one or more first level communication hubs and said one or more external circuit devices have a higher bandwidth capability than connections between said individual functional selected said IP cores and said third level communication hubs.

4. The IC architecture of claim 1, wherein individual functional selected said IP cores within a given sub-cluster are of varying sizes and shapes.

5. The IC architecture of claim 1, wherein one or more of said individual functional selected said IP cores are configured for selective connection to external input/output devices.

6. A system-on-chip (SOC) device, comprising:
   a local microprocessor;
   a local memory device;
   a bus controller; and
   a library of intellectual property (IP) cores configured to provide a plurality of individual circuit functions;
   said IP cores arranged so as to enable a customized, functional selection of individual ones of said IP cores;
   wherein individually functional selected said IP cores are accessible through a star based communication structure included within said library, the star based communication structure further comprising:
      one or more first level communication hubs configured for communication with one or more external circuit devices with respect to said library;
      a plurality of sub-clusters in communication with each of said first level communication hubs, through second level communication hubs; and
      said plurality of sub-clusters further comprising a plurality of third level communication hubs in communication with a corresponding one of said second level communication hubs;
      wherein subsets of said IP cores associated with a given sub-cluster are configured for selective coupling to one or more of said third level communication hubs.

7. The SOC device of claim 6, further comprising:
   a given one of said third level communication hubs is centrally located with respect to a subset of said IP cores associated therewith;
   a given one of said second level communication hubs of an associated sub-cluster is centrally located with respect to said third level communication hubs in said associated sub-cluster; and
   a given one of said first level communication hubs is centrally located with respect to a subset of sub-clusters associated therewith.

8. The SOC device of claim 6, wherein connections between said one or more first level communication hubs and said one or more external circuit devices have a higher bandwidth capability than connections between said individual functional selected said IP cores and said third level communication hubs.

9. The SOC device of claim 6, wherein individual functional selected said IP cores within a given sub-cluster are of varying sizes and shapes.

10. The SOC device of claim 6, wherein one or more of said individual functional selected said IP cores are configured for selective connection to external input/output devices.

11. A method for implementing a customizable integrated circuit (IC) architecture, the method comprising:
  configuring a library of intellectual property (IP) cores to provide a plurality of individual circuit functions;
  arranging said IP cores so as to enable a customized, functional selection of individual ones of said IP cores;
  wherein individually functional selected said IP cores are accessible through a star based communication structure included within said library, wherein configuring the star based communication structure further comprises:
    configuring one or more first level communication hubs for communication with one or more external circuit devices with respect to said library;
    configuring a plurality of sub-clusters in communication with each of said first level communication hubs, through second level communication hubs;
    said plurality of sub-clusters further comprising a plurality of third level communication hubs in communication with a corresponding one of said second level communication hubs; and
    configuring subsets of said IP cores associated with a given sub-cluster for selective coupling to one or more of said third level communication hubs.

12. The method of claim 11, further comprising:
  centrally locating a given one of said third level communication hubs with respect to a subset of said IP cores associated therewith;
  centrally locating a given one of said second level communication hubs of an associated sub-cluster with respect to said third level communication hubs in said associated sub-cluster; and
  centrally locating a given one of said first level communication hubs with respect to a subset of sub-clusters associated therewith.

13. The method of claim 11, wherein connections between said one or more first level communication hubs and said one or more external circuit devices have a higher bandwidth capability than connections between said individual functional selected said IP cores and said third level communication hubs.

14. The method of claim 11, wherein individual functional selected said IP cores within a given sub-cluster are of varying sizes and shapes.

15. The method of claim 11, further comprising configuring one or more of said individual functional selected said IP cores for selective connection to external input/output devices.

* * * * *